United States Patent [19]

Terzian

[11] Patent Number: 4,831,623
[45] Date of Patent: May 16, 1989

[54] SWAP SCAN TESTING OF DIGITAL LOGIC

[75] Inventor: John Terzian, Winchester, Mass.

[73] Assignee: Raytheon Company, Lexington, Mass.

[21] Appl. No.: 74,101

[22] Filed: Jul. 16, 1987

[51] Int. Cl.$^4$ .................. G06F 11/00; G01R 31/28
[52] U.S. Cl. ............................................ 371/15
[58] Field of Search ............. 371/15, 25; 324/73 R, 324/73 AT

[56] References Cited

U.S. PATENT DOCUMENTS

| | | | |
|---|---|---|---|
| 4,366,393 | 12/1982 | Kasuya | 371/15 |
| 4,602,210 | 7/1986 | Fasang et al. | 324/73 R |
| 4,612,499 | 9/1986 | Andresen et al. | 324/73 R |
| 4,670,877 | 6/1987 | Nishibe | 371/15 |
| 4,701,916 | 10/1987 | Naven et al. | 371/15 |
| 4,701,920 | 10/1987 | Resnick et al. | 371/25 |

Primary Examiner—Charles E. Atkinson
Attorney, Agent, or Firm—Philip J. McFarland; Richard M. Sharkansky

[57] ABSTRACT

Apparatus and method for dynamically testing logic circuits transparent to their normal operation without placing restrictions on the logic circuit design. The apparatus is a swap scan register including an operational register for storing operational data and a test register for storing test data. The operational and test registers operate independently of each other. A swap circuit enables exchanging the operational and test register contents. According to the method disclosed after test data is stored in the test register, the operational register is interrupted and its contents swapped with the test register for one clock cycle. The test and operational registers are then swapped again to restore the original operational data to its pre-interrupt state and to provide test results in the test register.

10 Claims, 7 Drawing Sheets

SWAP SCAN TESTING OF DIGITAL LOGIC

BACKGROUND OF THE INVENTION

This invention relates to electronic digital logic test methods and apparatus and particularly to those capable of dynamic testing.

Efficient and accurate testing of digital logic systems is an increasingly important consideration for the electronic system designer. An ideal approach is to have test circuits and interfaces built in to the system, to allow initial state loading and prior state restoration, to operate dynamically so testing can occur while the system operates at full speed, and to be transparent to the end application of the system. If the test circuits are truly transparent, normal system operation can continue unaffected by test operation. This allows isolation of faults experienced during system operation which are difficult or impossible to diagnose by more conventional test circuits and/or diagnostic programs.

These design goals are particularly difficult to meet in the context of on-chip testing of very large scale integrated circuits where test circuit layout space and access for external test signals are limited, and switching speeds are critical. In fact, a design philosophy for testability is an absolute must in such situations, such as that typified by the level sensitive scan technique described in U.S. Pat. No. 3,761,695 to Eichelberger, issued Sept. 25, 1973, and assigned to International Business Machines Corporation. However, such techniques enhance testability at the expense of reducing design flexibility.

U.S. Pat. No. 4,357,703 to Van Brunt, issued Nov. 2, 1982, and assigned to Control Data Corporation appears to disclose a system for dynamic logic testing at full clock rates. The system cannot restore a prior state without reloading an input shift register from a test data input, and thus is not transparent to the end application.

U.S. Pat. No. 3,961,254 to Cavaliere, et al., issued June 1, 1976, and assigned to International Business Machines Corporation appears to disclose means for bypassing operational logic circuits to scan information directly into operational registers. The system does not allow testing of operational logic circuits at full speed nor is it capable of testing transparent to the end application.

U.S. Pat. No. 4,566,104 to Bradshaw, et al., issued Jan. 21, 1986, and assigned to International Computers Limited of London, England, appears to disclose a test apparatus including a plurality of series connected bistable elements coupled to combinatorial logic. No mention is made of the need to restore the bistable elements to their pre-test state. Further, because Bradshaw, et al. do not provide means for presetting all bistable elements in the system under test, the diclosed test equipment cannot execute the well-known Roth algorithm for non-functional testing of digital subsystems.

SUMMARY OF THE INVENTION

It is among the objects of this invention to provide a scheme for testing digital logic that permits dynamic operation that is concurrent with and transparent to the operational portions of the logic, and which places little or no restrictions on the logic designer.

These and other objects are accomplished by a digital logic apparatus including two conventional registers, one an operational register and the other a test register. The operational register is used as a conventional register to store operational data from the operation of the systems application logic. Operational data provided to its data inputs is stored when an operational clock pulse is received at a clock input. The test register has its own data and clock inputs that are accessible independent of the operational register. Thus, the test register can be storing test data while the operational register is storing operational data. Circuits are included to enable swapping data stored in the operational and test registers. The operational and test register pair may be referred to as a swap scan register.

In operation, the operational register is used like a conventional register to repeatedly, in response to operational clock pulses, store operational data from the operation of the application logic. The test register stores test data, and does so during operation of the operational register. A test sequence is performed by interrupting the operational clock and swapping data in the operational and test registers. The operational register is then sent one clock pulse to cause the test data to be sent through the application logic and test results to be returned. The operational and test registers are swapped again to restore the operational register to its state before the test and to feed the test results to the test register. The operational register then resumes normal operation, and the contents of the test register may be read out, transparent to continuing operation of the operational register.

A logic circuit apparatus in accordance with the invention thus includes swap scan registers used in place of conventional single registers. The apparatus can be arranged as a chain or pipeline of application logic driving swap scan registers that drives other combinatorial logic that drives another swap scan register and so on. In this configuration, it is desirable to connect the test registers in series with each other. This allows loading of all test registers via a test data bus. A given system may have several test buses. The number of parallel bits of the test data bus may range from one to any convenient number of parallel bits. In the case of a single bit test data bus, the test registers may be implemented as universal serial/parallel registers.

The swap scan register can perform a logic analyzer function by actuating only the portion of the swapping circuit that allows the operational data to be read into the test register. The test register can then be read out to view the contents of the operational register.

The swapping circuit may include a pair of multiplexers, one for each of the operational and test registers, and each coupled to control the input path to its respective register. Tri-state buffers or transmission gates may also be used.

An advantage of this arrangement is that it allows dynamic testing of a digital logic circuit apparatus that is truly transparent to the operational portion of the apparatus and thus also transparent to the end application.

BRIEF DESCRIPTION OF THE DRAWINGS

These and other objects, features, and advantages become apparent upon examination of the following detailed description add accompanying drawings where.

DETAILED DESCRIPTION OF THE PREFERRED EMBODIMENTS

Figure 1:
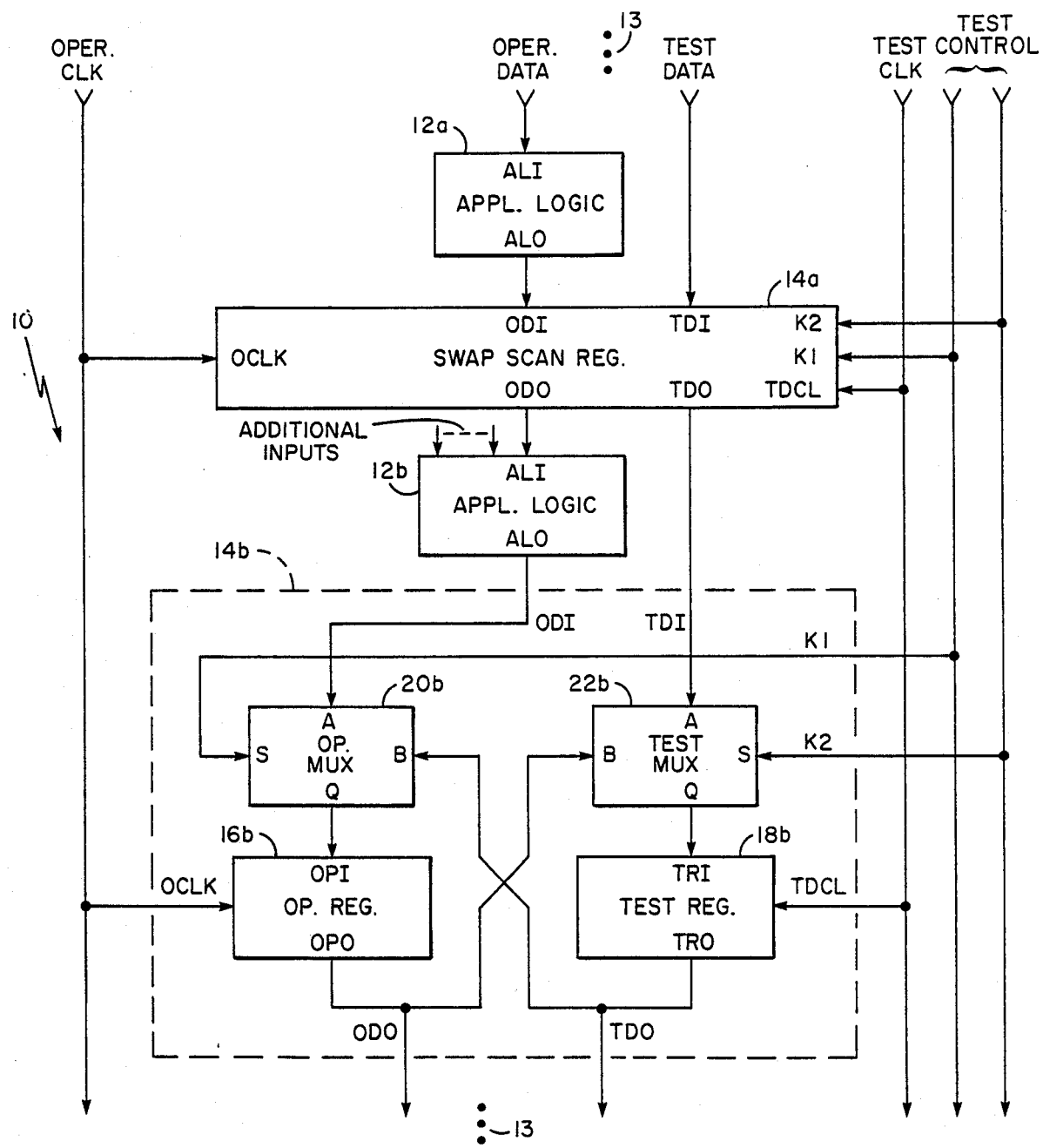
FIG. 1 is a block diagram of an apparatus according to the invention, using a parallel arrangement for a test register.

Turning attention now to the drawings, where like reference characters designate corresponding parts throughout the several views, FIG. 1 shows a block diagram of the invention including a digital logic system 10 including application logic 12a and swap scan register 14a. Operational data signals OPER DATA are fed to an application logic input ALI of application logic 12a. Logic 12a performs logical operations on this input ALI to generate application logic output signals ALO. Thus, logical operations performed by application logic 12a are in accordance with the end application for logic system 10. Signals OPER DATA, ALI, ALO and the other signals labeled in FIG. 1 are to be understood to represent multi-bit data signals or data buses.

The ALO output of logic 12a is fed to an operational data input ODI of swap scan register 14a. Swap scan register 14a serves several functions. One function is an operational register for storing the results of the operation of application logic 12a on the OPER DATA signals. These results are stored upon receipt of operational clock pulses OPER CLK at its operational clock input OCLK. Swap scan register 14a provides the stored results as operational data output signals ODO.

Output signals ODO are typically in turn fed to additional application logic 12b, together with possible inputs from additional swap scan registers. Another swap scan register 14b is coupled to the output ALO of application logic 12b to store the results of the operation of application logic 12b. Additional application logic and swap scan registers may be similarly cascaded as indicated by dots 13. Other portions of logic system 10 may have additional cascaded registers operating in parallel with those shown.

This arrangement of cascaded sequential and combinatorial logic is really quite general. For example, the logic system 10 might be a pipelined arithmetic unit where application logic 12a performs arithmetic operations and swap scan regiser 14a stores results for a next arithmetic operation performed by application logic 12b, and so on. Logic system 10 might also be memory where application logic 12a performs address decoding, swap scan register 14a is an address register, application logic 12b is a memory array and swap scan register 14b is a data register.

Swap scan registers 14a and 14b also serve to test for proper operation of application logic 12a and 12b, respectively. This is accomplished by having swap scan registers 14a and 14b arranged, independent of their other functions, to store TEST DATA signals provided to their test data inputs TDI, upon receipt of a clock pulse at their test data clock inputs TDCL. Clock pulses for the TDI inputs are provided by a TEST CLK signal. The stored TEST DATA signals are available at a test data output TDO. TEST CONTROL signals are also fed to control inputs K1 and K2. These enable swapping the stored operational and test data, as will be seen. Note the test portions of swap scan registers 14a and 14b are coupled in series—that is, the test data output TDO of swap scan register 14a is coupled to the test data input TDI of swap scan register 14b. This allows loading of test data for more than one swap scan register through a single TEST DATA input bus. To load TEST DATA into each of the swap scan registers 14a, 14b, etc. in the series merely requires sending a sufficient number of clock pulses on the TEST CLK input. If the test data input bus TDI is bit serial, the number of clocks required is equal to the total number of stages in the entire chain of test registers. If the test data bus is wider than one bit, the number of clock pulses required is equal to the total number of register stages divided by the width of the test data bus.

Elements of swap scan register 14b are shown with greater detail, including operational register 16b, test register 18b, operational multiplexer 20b, and test multiplexer 22b. Operational register 16b stores data fed to its operational parallel inputs OPI upon receipt of a clock pulse at its operational clock input OCLK. Stored data is available at its operational parallel outputs OPO. Likewise, test register 18b stores data provided at its test register input TRI upon occurrence of a clock pulse at its test data clock input TDCL, and couples the stored data at its test data output TDO. However, it is seen that operational data originating at the operational data input ODI of swap scan register 14b is not directly fed to the operational parallel inputs OPI of operational register 16b, but rather are coupled to a first data input A of operational multiplexer 20b. A second data input B of operational multiplexer 20b is coupled to the test register output TRO of test register 18b. Operational multiplexer 20b is a conventional two-to-one multiplexer, for selecting, in accordance with the control signal K1 fed to its select input S, one of its A or B inputs to be coupled to its output Q. Output Q of operational multiplexer 20b is then fed to the operational parallel inputs OPI of operational register 16b. Likewise, test data originating at the test data input TDI of swap scan register 14b is fed to a first input A of test multiplexer 22b. A second input B of test multiplexer 22b is coupled to the operational parallel output OPO of operational register 16b. Select input S is controlled by control signal K2.

Figure 1A:
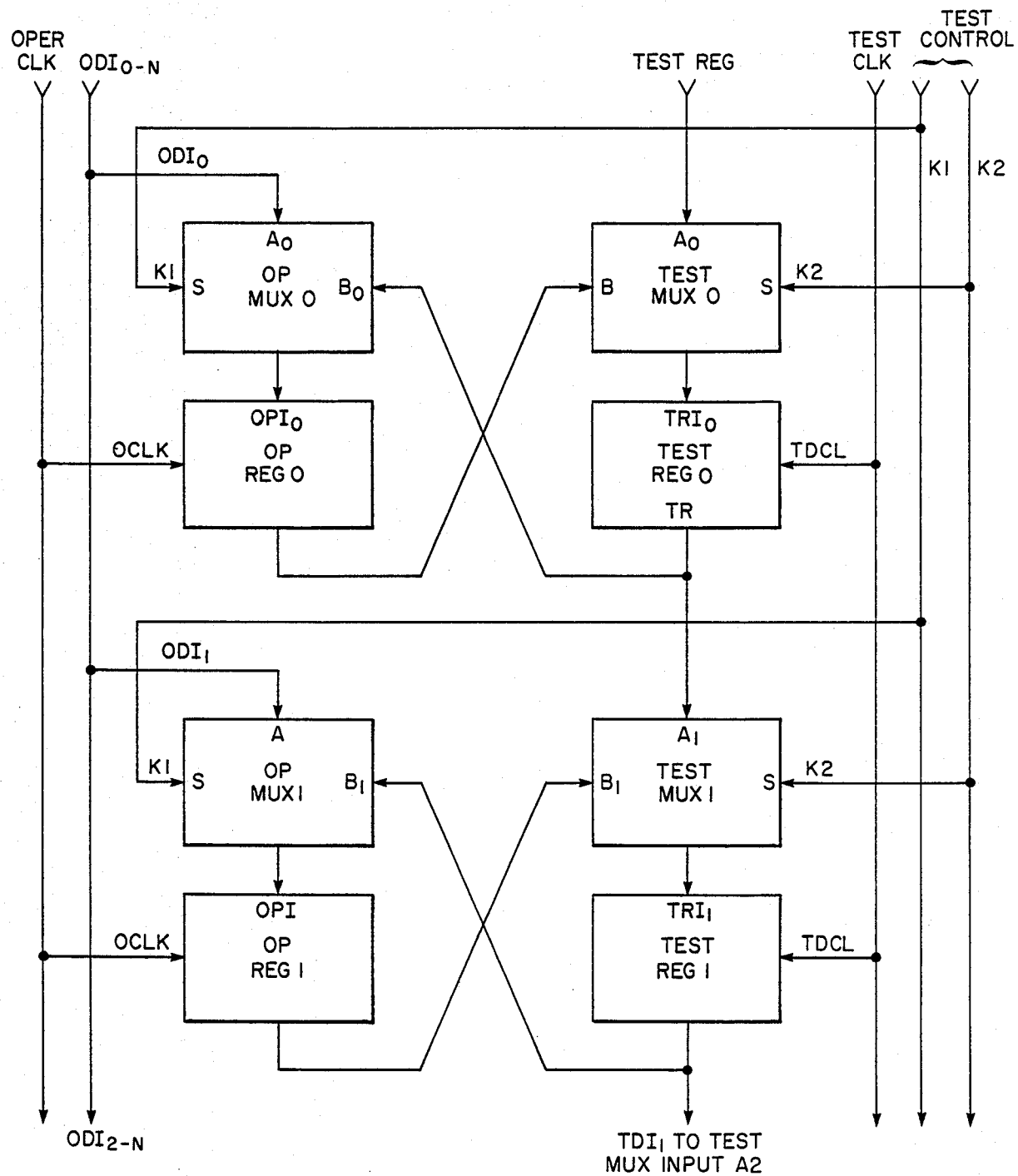
FIG. 1A is similar to FIG. 1 except showing a serial arrangement for a test register.

In some instances, the first data input A of test multiplexer 22b is not as wide as the second data input B, such as when the TEST DATA bus is single bit or serial. In such an instance, the A input bits $A_o \ldots A_N$ can be coupled in series with the bits $TR_o \ldots TR_N$ of test register 18b, having output bit $TR_o$ drive A1 in turn driving input bit $TR_1$, etc. Test register 18b is thus loaded serially through test multiplexer 22b. The arrangement is illustrated in FIG. 1A.

During normal operation of logic system 10 in FIG. 1, operational data is modified by application logic 12b and results fed to the operational data input ODI of swap scan register 14b. Control signal K1 is set to allow coupling of the ODI inputs to operational register 16b through operational multiplexer 20b. They are then stored upon occurrence of a clock pulse at the OCLK input of operational register 16b. New operational data is presented to logic system 10, and another clock pulse is provided on the OPER CLK signal. Control signal K2 is also set to allow test data provided at the test data input TDI of swap scan register 14b to be fed to the test register input TRI of test register 18b, where it is stored upon occurrence of a clock pulse in the test data clock input TDCL. The storing of test data thus occurs concurrently with and independent of the operations of operational register 16b. A test sequence is performed as follows. After test data is loaded, control inputs K1 and K2 are set to allow feeding the test register output TRO to the operational parallel input OPI and the operational parallel output OPO to the test register input TRI. Upon the next occurrence of clock pulses on the OPER CLK and TEST CLK signals, the data in the operational register 16b and test register 18b are swapped. The data between registers 16b and 18b is preferably parallel to minimize swapping time, but other arrangements are possible, as will be later described. Control signals K1 and K2 are then returned to reselect their A input. The next clock pulse in the OPER CLK signal causes the logic system 10 to operate on the test data for one clock cycle. The test clock does not operate during this OPER CLK., Control signals K1 and K2 then are returned to select their B inputs and when the next clock pulses appear on the OPER CLK and TEST CLK signals, the contents of operational register 16b and test register 18b are again swapped. This restores the contents of operational register 16b to their state before the test sequence was executed and provides the test results of testing application logic 12b in register 18b. Test results are then shifted out the TEST DATA bus. This shifting out of results can occur simultaneously with the shift in of new test data for the next test sequence.

The swap scan apparatus thus achieves dynamic testing transparent to the operation of operational register 16b as the contents of 16b are always returned to their previous operational state. The throughput impact of such testing can be quite minimal. For example, if the OPER CLK signal provides clock pulses at a rate of 10 Mhz and one test sequence is performed every 3000 clock pulses, tests are performed at a rate of 3333 per second and operational throughout is reduced by only 0.1%.

The apparatus of FIG. 1 can also function as a simple scanner or logic analyzer by enabling the K2 control signal to pass the B input of test multiplexer 22b to test register 18b while leaving the K1 control input to allow the A input of operational multiplexer 20b to pass to operational register 16b. In this mode, the operational register 16b continues to store operational data. Operational data is also stored in test register 18b where it can be periodically shifted out along the TEST DATA bus. This mode can be particularly useful when there is a desire to isolate errors experienced by the applications logic but not by a test data sequence. The errors can be isolated by operating logic system 10 in a repetitive loop.

A logic system 10 may thus be designed so that every register is implemented as a swap scan register. This provides logic test capability at every bit of the system while allowing the system designer freedom to design the combinatorial logic portion in any manner deemed appropriate, without having to follow design rules for testability.

Figure 2:
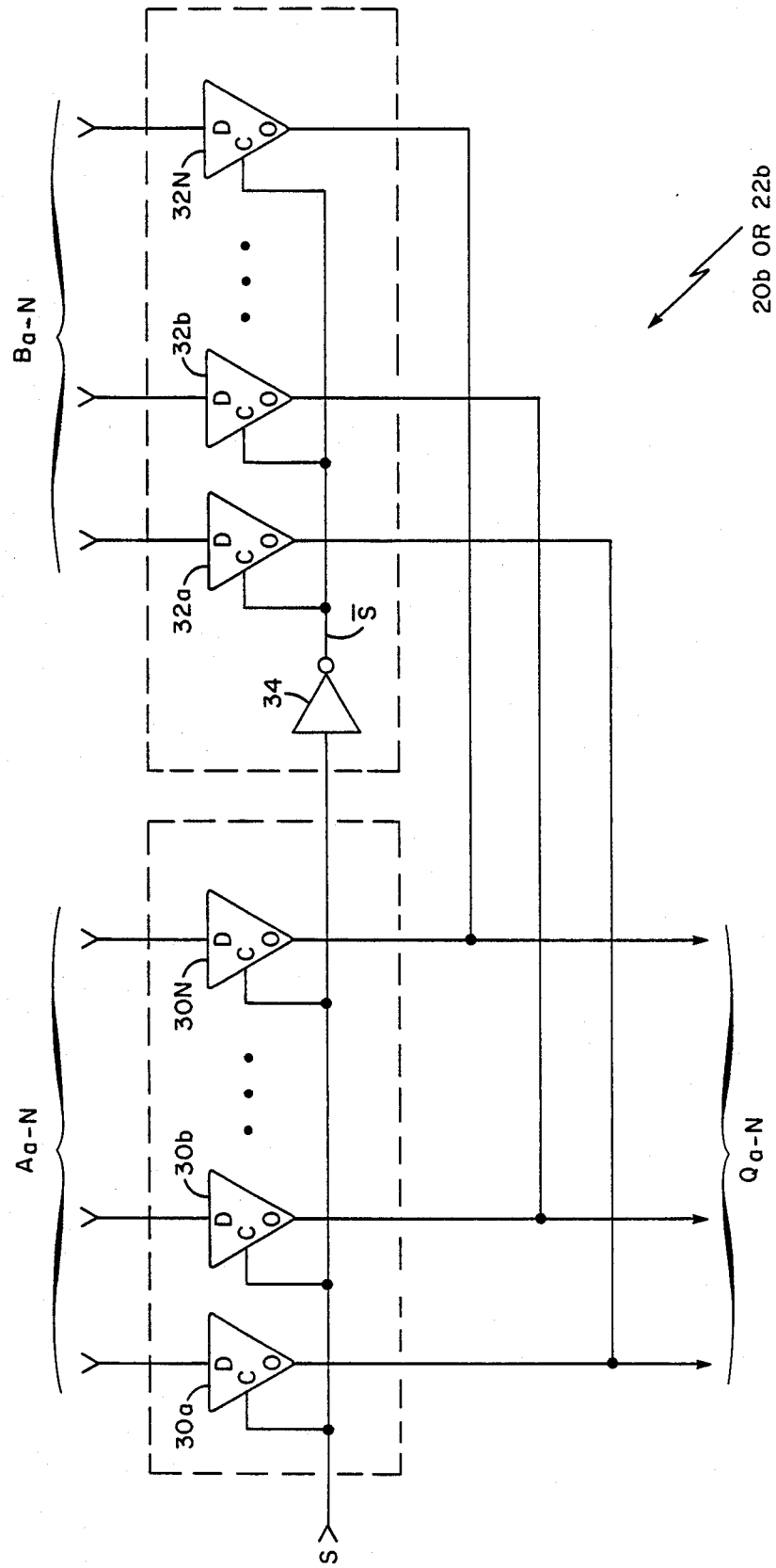
FIG. 2 is a schematic of an alternate embodiment for the multiplexers.

FIG. 2 shows how a typical operational multiplexer 20b or test multiplexer 22b may be implemented using tri-state buffers. A plurality of buffers 30a, 30b, ... 30N of like number as the number of bits $A_{a-N}$ in first input A have their respective data inputs D coupled to a corresponding one of the bits $A_{a-N}$. Likewise, a second plurality of buffers 32a, 32b, ... 32N are coupled to the bits Ba-N of second input B. Buffers 30a, 30b, ... 30N and 32a, 32b, ... 32N are of the tri-state type having a control input C that allows coupling of a data input D to an output O when in one state and providing a high impedance output O when in another state. The control inputs for buffers 30a, 30b, ... 30N are directly coupled to control signal S. Buffers 32a, 32b, ... 32N are fed an inverted control signal $\overline{S}$ developed by an inverter 34. Thus, when buffers 30a, 30b, ... 30N are enabled by signal S being in one state, inputs $A_{a-N}$ appear at outputs $Q_{a-N}$. When signal S is in the other state, inputs $B_{a-N}$ are coupled to outputs $Q_{a-N}$, as buffers 32a, 32b, ... 32N will be enabled and buffers 30a, 30b, ... 30N will be in the high impedance state.

Figure 3:
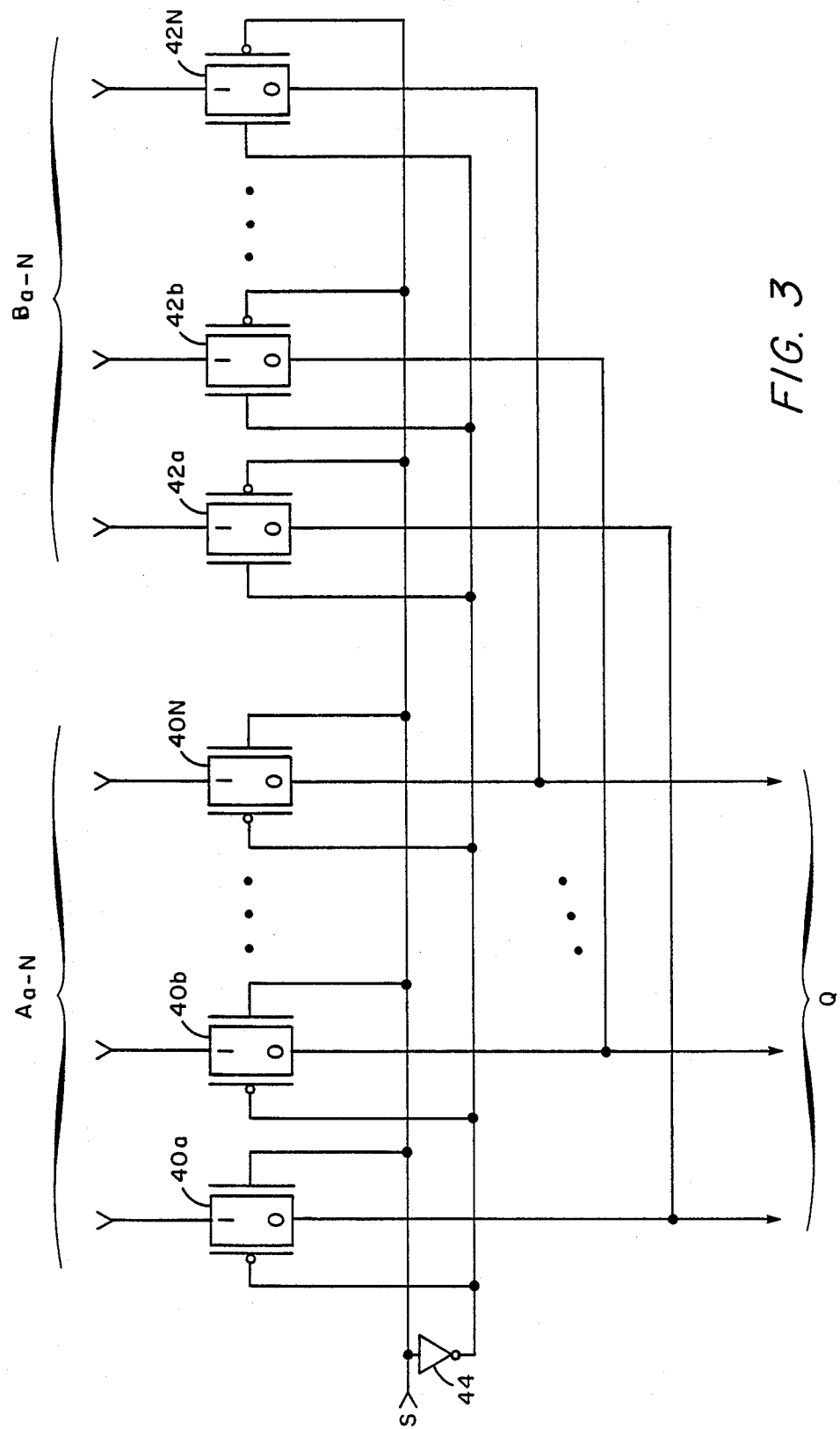
FIG. 3 is a schematic of another embodiment for the multiplexers.

Operational multiplexer 20b may also be embodied using transmission gates as in FIG. 3. That is, each of a plurality of transmission gates have their inputs, I, coupled to a corresponding one of the bits $A_{a-N}$ of first input A, and each of a plurality of transmission gates 42, 42b, ... 42N have their inputs I coupled to a corresponding one of the bits $B_{a-N}$ of second input B. Gates 40a, 40b, ... 40N and 42a, 42b, ... 42N of the type having an inverting control input (denoted by an adjacent not symbol) and a non-inverting control input. In order for such gates to couple their input I to an output O, the inverting input must have a logic zero voltage level and the non-inverting input a logic one level. So that only one set of transmission gates conducts at a given time, the non-inverting inputs of gates 40a, 40b, ... 40N are coupled to the inverting inputs of gates 42a, 42b, ... 42N and to control input signal S. The inverting inputs of gates 40a, 40b, ... 40N are driven by an inverted control signal $\overline{S}$ developed by an inverter 44. The non-inverting inputs of gates 42a, 42b, ... 42N are coupled to this inverted control signal $\overline{S}$.

Figure 4:
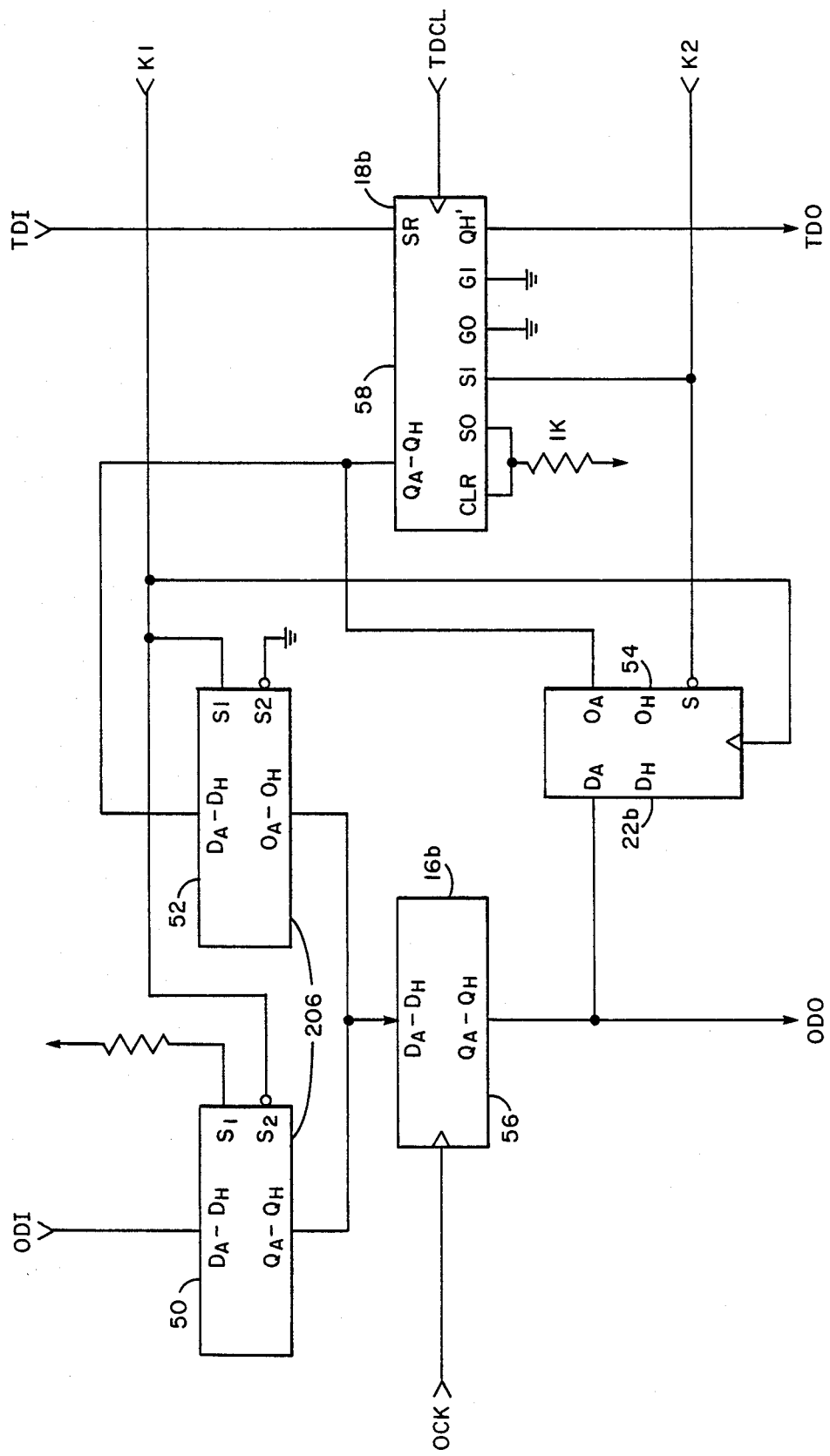
FIG. 4 is a schematic of an alternate embodiment for the swap scan register.

The embodiments discussed above contemplate the use of a parallel TEST DATA bus. There are certain advantages to having a serial TEST DATA bus, the most important being a reduced number of wires to be fed to each swap scan register. A disadvantage is an increase in the time required to load and read out the test register of each swap scan register. An embodiment of an eight bit wide swap scan register 14b using a serial test data bus constructed from off-the-shelf integrated circuits is shown in FIG. 4. This embodiment includes two eight-bit tri-state buffers 50 and 52, an eight-bit latch 54, an eight-bit register 56, and an eight bit universal shift/storage register 58. Register 56 serves as the operational register 16b of FIG. 1 and universal register 58 serves as the test register 18b and portions of test multiplexer 22b as will be seen. Buffers 50 and 52 are respectively fed the operational data input ODI and the parallel input/outputs Qa-Qh of universal register 58. They thus serve as the operational multiplexer 20b to select one of these to be fed to register 56. Universal register 58 is accessible as a parallel register through parallel input/outputs Qa-Qh or as a serial shift register through serial input SR and serial output Qh'. Input/outputs Qa-Qh are bi-directional; that is, they function as parallel outputs when control input S1 is a logic zero and as parallel inputs when S1 is a logic one. Latch 54 is coupled between the outputs Qa-Qh of register 56 and the input/outputs of register 58.

With the K1 and K2 inputs a logic zero, the not enable input S2 of buffer 50 allows operational data input ODI to be fed to register 56 and hence to operational data output ODO when a clock pulse is received at operational clock input OCLK. Test data input TDI is serially fed into universal register 58 and eventually out through QH' and thus to test data output TDO upon occurrence of clock pulses at the test data clock input TDCL.

To effectuate a swap of the contents of registers 56 and 58, control K1 is changed to a logic one. This enables the contents of universal register 58 to be fed through buffer 52 to the inputs of register 56. It also clocks register 54 thereby saving the operational data from register 56. An operational clock pulse OCLK stores the test data into register 56. Control signal K2 is then raised to a logic one level, enabling the output of register 54 and causing the input/outputs Qa-Qh of register 58 to act as inputs. A pulse fed on input test data clock TDCL causes the operational data to be stored by register 58. Control signal K1 and K2 can now be returned to a logic zero level to complete the swap sequence. The rest of the test sequence proceed as previously described for the embodiment of FIG. 1.

In other applications, it is desirable to have the operational register 16b and test register 18b of FIG. 1 work from separate asynchronous clocks. A control circuit 60 shown in FIG. 5 may be useful in generating the necessary TEST CLK and TEST CONTROL signals to be fed to the TDCL, K1 and K2 inputs of swap scan register 14b. Control circuit 60 includes four D flip-flops 62, 64, 66, and 68 and gates 70, 72, 74, 76, 78, 80, and 82, and or-gates 84 and 86. The operational clock signal OCLK is fed to a clock input of each D flip-flop 62, 64, 66, and 68. An asynchronous test clock signal TCK that need not be synchronous with respect to the operational clock OCLK is fed to one input of and-gate 70. The other input of and-gate 70 is fed by a copy signal CPY. As described shortly, the CPY signal changes from low to high at or near a rising edge of the TCK signal to initiate copying of the contents of operational register 16b into test register 18b (FIG. 1). A DC mode control signal called SWAP is also input to control circuit 60 at an input to and-gate 80. The output of and-gate 70 is coupled to a D input of D flip-flop 62. The Q output F1 of flip-flop 62 is coupled to the D input of flip-flop 64, and to one input of and-gate 74. The other input of and-gate 74 is $\overline{F2}$ from flip-flop 64. Another and-gate 72 has inputs to the $\overline{F3}$ output of flip-flop 66 and the F4 output of flip-flop 68. The outputs of and-gates 72 and 74 are fed to or-gate 84 which drives the D input of flip-flop 66. The F3 output of flip-flop 66 is used as control signal K2. Control signal K1 is developed by and-gate 80 having its other input coupled to the F3 output of flip-flop 66. And-gate 76 has inputs $\overline{F3}$ and F4 while and-gate 78 has inputs F3 and $\overline{F4}$. F4 and $\overline{F4}$ are developed by flip-flop 68. Or-gate 86 operates on the outputs of and-gates 76 and 78 to develop the D input for flip-flop 68. The TDCL clock signal is formed by and-gate 82 operating on the TCK and $\overline{F3}$ signals.

As will be seen, activation of the control signal CPY will always result in subsequent activation of K2, thereby causing a data transfer from the operational register to the test register. If the control signal SWAP is also high, K1 will be activated in synchronism with K2 and a full swap operation will occur. If SWAP is not active, only the transfer from the operational register to the test register will occur, thereby effecting the logic analyzer mode of operation previously mentioned.

Figure 5:
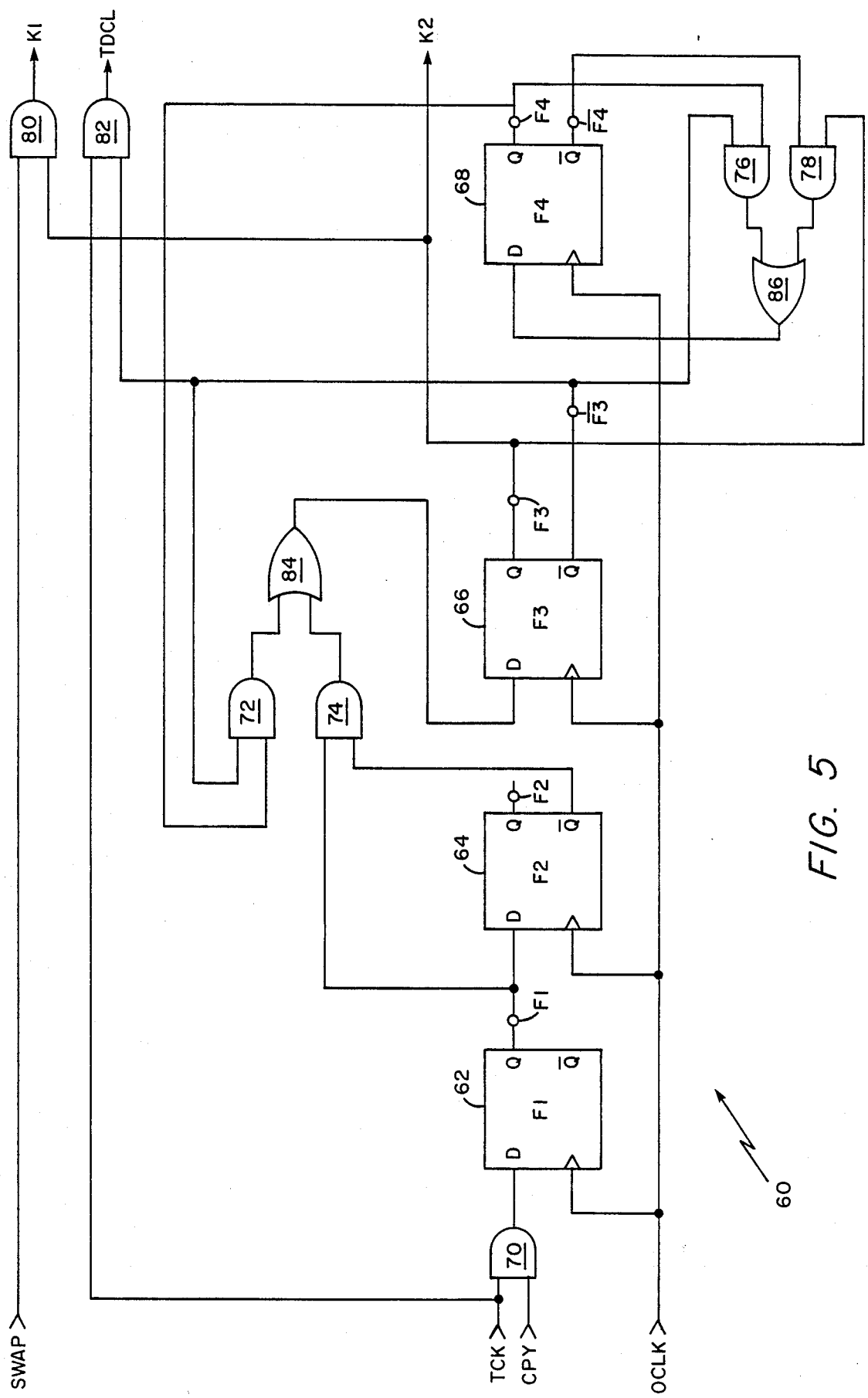
FIG. 5 is a schematic of a control circuit using asynchronous clocks.
Figure 6:
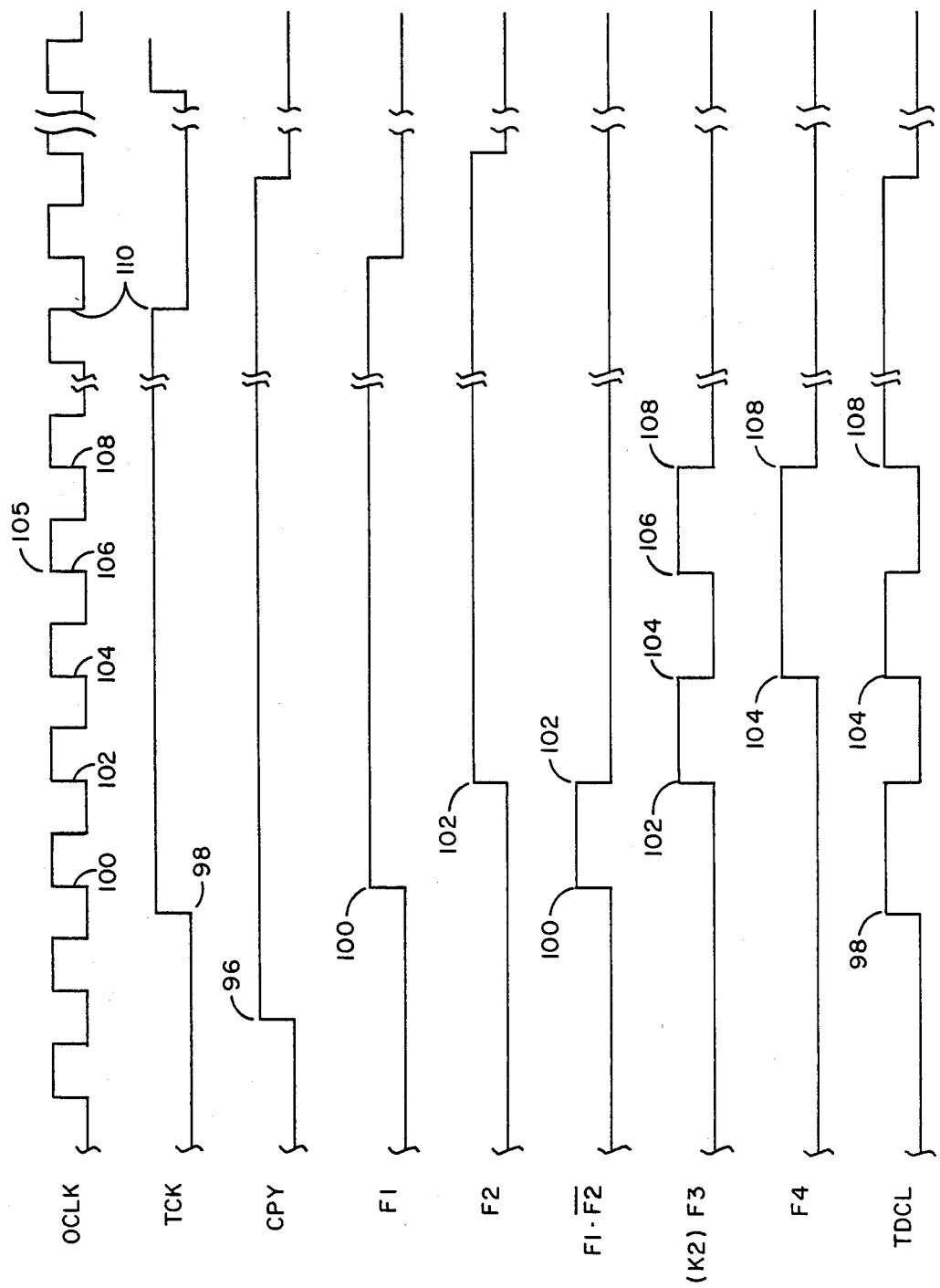
FIG. 6 is a timing diagram for the control circuit.

The timing diagram of FIG. 6 illustrates the operation of control circuit 60. The asynchronous clock signals OCLK and TCK are combined by the control circuit to generate the test data clock signal, TDCL. Transitions on TDCL, not present in TCK, cause the data transfers between the test register and the operational register to occur in synchronism with the OCLK. OCLK is typically clocked at a rate much faster than TCK. The rising edges of both clocks OCLK and TCK cause data to be loaded into operational register 16b and test register 18b, respectively. The rising edge at 98 in TCK, which also occurs in TDCL, is the one that shifts the last bit of data into the test register in preparation for the test operations. The copy signal, CPY, is brought high in proximity to rising edge 98 on TCK. Having both TCK and CPY in high causes F1, the output of flip-flop 62 to go high at time 100 on the next occurrence of a rising edge in operational clock OCLK. The following OCLK rising edge at time 102 causes the output F2 of flip-flop 64 to also go high. The output F1, $\overline{F2}$ of and-gate 74 is thus high between lines 100 and 102. As this is fed to the input of flip-flop 66, its output F3 goes high at time 102. However, F2 goes high F2 low) also at time 102, so by time 104, F3 will again go low. The combined high F3 and low F4 at time 104 causes F4 to go high at this time. At time 106, F3 must again go high because $\overline{F3}$ is high (F3 low) and is high. F4 will remain high here because F4 is high and $\overline{F3}$ is high. At time 108, F3 and F4 return to logic low since their state is logic high and $\overline{F2}$ is low. A subsequently logic low in TCK at time 110 cleans F1, F2, F3, and F4. The TDCL signal developed by adding F3 and TCK thus has three rising edges, at times 98, 104, and 108. Control signals K1 and K2 are developed as shown in FIG. 5. As previously indicated, the rising edge of TDCL at 98 shifts the last test data into test register 18b. The next rising edge at time 104 causes data transfers between registers 16b and 18b under control of K1 and K2. The operational clock OCLK has a pulse at time 106 between times 104 and 108, thereby causing the operational register 16b to store the results of application logic 12a operating on either test data (K1 high) or operational data (K1 low). The third TDCL pulse at time 108 repeats the data transfers between registers 16b and 18b.

Having described preferred embodiments of the invention, numerous variations may now become apparent to those skilled in the art. Although this is described as a test apparatus, it can be used as an initial condition loader by enabling the test register 18b to operational register 16b path only. It can also be used as a very fast program interrupt control processor since the swap operation can be made to save and then restore processor states prior to the program interrupt with only a single pair of pulses. It is felt, therefore, that this invention should not be limited in scope to the embodiments described above, but only by the scope of the following claims.

What is claimed is:
1. A logic circuit comprising:
   (a) an operational register means, coupled to receive operational data at an input, for providing stored operational data at an output in response to an operational clock signal;
   (b) test register means, coupled to receive test data at an input, for providing stored teat data at an output in response to a test clock signal;
   (c) swapping means, responsive to a test control signal, for coupling the output of the operational register means into the input of the test register means and for coupling the output of the test register means into the input of the operational register means, for swapping the stored operational data and stored test data.

2. Apparatus as in claim 1 where the swapping means comprises:
operational multiplexer means, coupled to receive a operational data at a first input and the stored test data at a second input, and coupled to the operational register, for providing in accordance with an operational multiplexer select input one of the operation data or stored test data to the operational register input.

3. Apparatus as in claim 1 where the swapping means comprises:
test multiplexer means, coupled to receive test data at a first input and the stored operational data at a second input, and coupled to the test register, for providing, in accordance with a test multiplexer select input, one of the test data or stored operational data to the test register input.

4. Apparatus as in claim 3 where the swapping means comprises:
operational multiplexer means, coupled to receive operational data at a first input and the stored test data at a second input, and coupled to the operational register, for providing, in accordance with an operational multiplexer select input, one of the operation data or stored test data to the operational register input.

5. Apparatus as in claim 2 where the operational multiplexer means comprises:
two sets of transmission gates, each set having a plurality of gates, the inputs of the first transmission gate set coupled to receive the operational data and the inputs of the second transmission gate set coupled to receive the stored test data, and each one of the transmission gates in the first set having an output coupled to an output of a corresponding transmission gate in the second set.

6. Apparatus as in claim 3 where the test multiplexer means comprises:
two sets of transmission gates, each set having a plurality of gates, the inputs of the first transmission gate set coupled to receive the test data and the inputs of the second gate set coupled to the receive stored operational data, and each one of the gates in the first set having an output coupled to an output of a corresponding transmission gate in the second set.

7. Apparatus as in claim 2 where the operational multiplexer means comprises:
two sets of buffers, each set having a plurality of buffers, the inputs of the first buffer set coupled to the receive operational data and the inputs of the second buffer set coupled to receive the stored test data, and each one of the buffers in the first set having an output coupled to an output of a corresponding buffer in the second set.

8. Apparatus as in claim 3 where the test multiplexer means comprises:
two sets of buffers, each set having a plurality of buffers, the inputs of the first buffer set coupled to receive the test data and the inputs of the second buffer set coupled to receive the stored operational data, and each one of the buffers in the first set having an output coupled to an output of a corresponding buffer in the second set.

9. A method of testing logic circuits comprising the steps of:
(a) repeatedly clocking operational data into an operational register;
(b) storing test data into a test register;
(c) interrupting the clocking of the operational test register;
(d) swapping contents of the operational and test registers;
(e) allowing a clock pulse to cause the test data to be sent through the logic circuit and a test result to be returned to the operational register;
(f) swapping contents of the operational and test registers; and
(g) reading the contents of the test register.

10. A logic circuit comprising:
a plurality of application logic means for providing application logic outputs in response to operational data coupled to combinatorial logic inputs;
a plurality of swap scan register means, each register means coupled to one of the application logic outputs at an operational data input, to an operational clock signal at an operational clock input, to a test clock signal at a test clock input, to a control signal at control inputs and each register means having a test data input and test data output, the test data input of at least one register means coupled to receive the test data output of at least one other register means, for storing operational data input as operational contents in response to the operational clock signal, and for storing test data input as test contents in response to the test clock signal, and for swapping the operational and test contents in response to the test control signal.

* * * * *